United States Patent [19]

Macovschi

[11] Patent Number: 4,866,377
[45] Date of Patent: Sep. 12, 1989

[54] PROXIMITY DETECTOR ALTERNATELY OPERATED TO DETECT AND SELF-CHECK

[75] Inventor: Mihail Macovschi, Lyons, France

[73] Assignee: ABB Petercem S.A., Chassieu, France

[21] Appl. No.: 38,905

[22] Filed: Apr. 16, 1987

[51] Int. Cl.⁴ .................... G01R 35/00; G01B 7/14; G01N 27/00
[52] U.S. Cl. .................................. 324/202; 324/207; 331/65
[58] Field of Search ............... 324/202, 207, 208, 225, 324/226; 246/249; 361/179, 180; 331/65, 117 B, 167

[56] References Cited

U.S. PATENT DOCUMENTS 4,084,135  4/1978  Enabnit .............................. 324/202
4,112,365  9/1978  Larson et al. ....................... 324/207

Primary Examiner—Reinhard J. Eisenzopf
Assistant Examiner—Walter E. Snow
Attorney, Agent, or Firm—Darby & Darby

[57] ABSTRACT

A proximity detector of the integrated electronic type which includes an oscillator, which detector detects the position of a target relative to a proximity zone limit by Eddy current changes. The detector is operated over a cycle having a first period during which its functioning is checked by alternately starting and stopping the oscillator and for a second period during which the position of the target is determined.

13 Claims, 4 Drawing Sheets

४,८६६,३७७

PROXIMITY DETECTOR ALTERNATELY OPERATED TO DETECT AND SELF-CHECK

BACKGROUND OF THE INVENTION

The invention concerns a self-checking proximity detector.

Proximity detectors permit detecting the crossing of a proximity zone limit by a target, in that they signal the crossing, inter alia, by a change in their direct current consumption. These detectors comprise either an integrated electronic system when generally they detect the target by the phenomenon of losses by Eddy currents, or an offset electronic system, when the physical phenomenon used for the detection of the target is the variation of inductance.

When they have an offset electronic system, the detectors are checkable, that is, it is possible to verify at a distance whether the sensitive part (the sensor) is in good working condition. However, these detectors present two serious disadvantages: the distance from the sensor to the electronic system is limited due to the influence of the line on the measurement, and if a measurement and a performance test are to be carried out simultaneously, a very complex electronic system must be provided.

When the detectors have an integrated electronic system, their operation can be verified only partially. The presence of a short circuit or of a circuit break can be established, but if the current consumption is normal, one cannot know whether the detector operates correctly.

OBJECTS OF THE INVENTION

It is an object of the present invention to provide a detector with integrated electronic system which can be checked at a distance with certainty.

Another object of the invention is to provide a detector of this type which is able to transmit simultaneously, to one or more remote receivers, a signal containing measurement information about the position of the target relative to the limit of the proximity zone as well as information about its own functioning.

BRIEF DESCRIPTION OF THE INVENTION

The invention relates to a self-checking proximity detector with integrated electronic system for detecting the position of a target relative to a proximity zone limit owing to the phenomenon of losses by Eddy currents, comprising an LC oscillating circuit and an oscillator. The detector has an oscillation counter which defines an operating cycle of the detector, with a first period for checking the functioning of the detector and a second period determining the position of the target.

According to other characteristics of the invention the detector comprises a circuit for bringing about the operation of the oscillator, a circuit for controlling the stopping of the oscillations, a monostable, circuit for controlling, alternately, one or the other of the above circuits, and a counter counting the oscillations which it receives from the oscillator and controlling the monstable circuit. The detector comprises a circuit for resetting the counter to zero after a defined time, so as to end the operating cycle of the detector in the absence of oscillations, that is, when the target is close.

During the first period of the operating cycle of the detector, the signals permitting the checking of the correct functioning of the detector consist of two current pulses separated by a gap. Each of said current pulses has a duration equal to that of the pulse of the monostable circuit, and the duration of said gap is function of the frequency of the oscillations. The duration of the second period of the operating cycle of the detector is characteristic of the position of the target relative to the limit of the proximity zone. When the target is remote, the duration of said second period of the cycle is defined by counting of the oscillations and when the target is close, the duration of said second period of the cycle is defined by the period of the zeroing circuit.

BRIEF DESCRIPTION OF THE DRAWINGS

Other characteristics of the invention will become evident from the description which follows, made with reference to the annexed drawing in which can be seen.

DETAILED DESCRIPTION OF THE INVENTION

Figure 1:
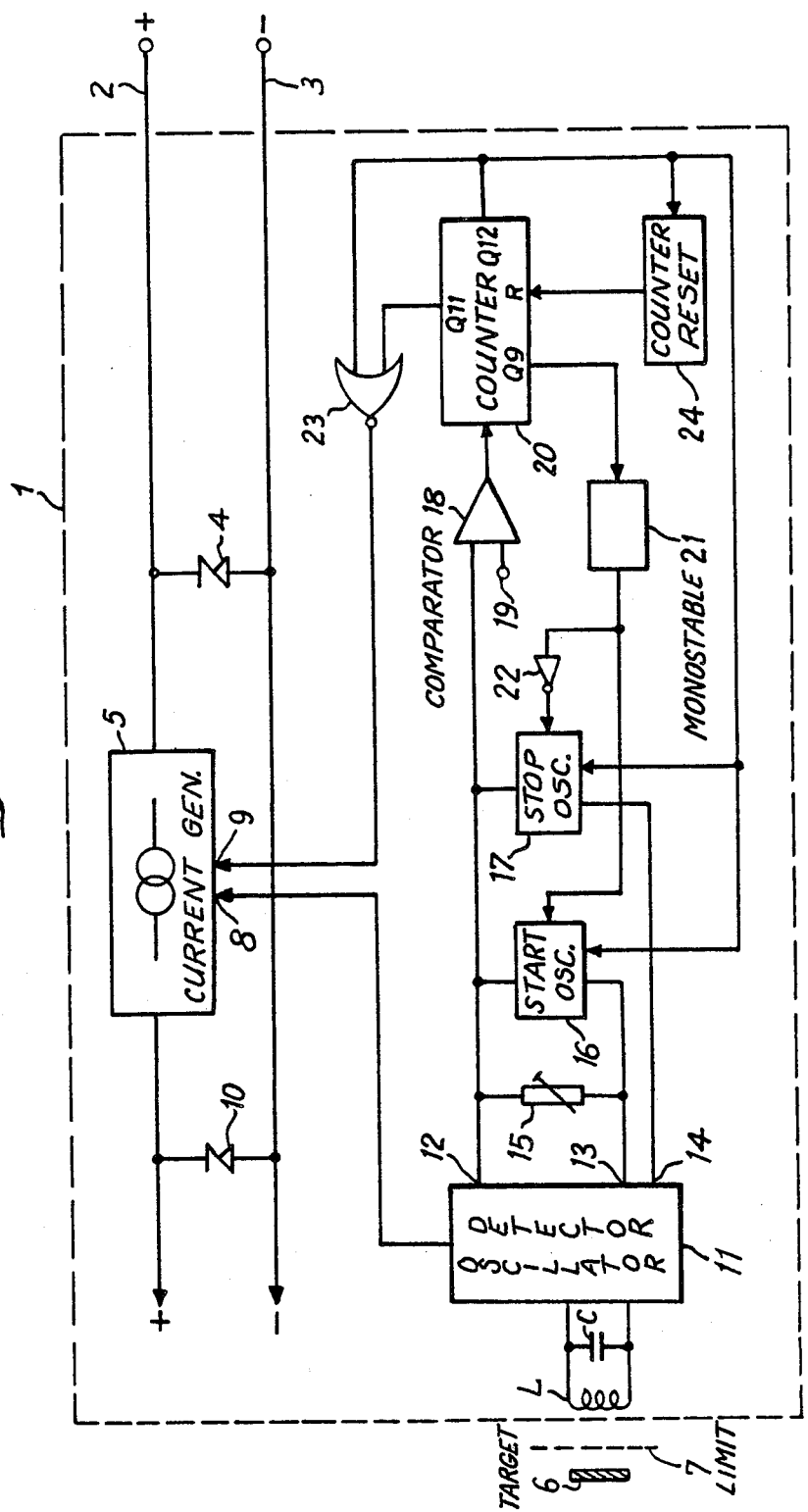
FIG. 1 is a block diagram of a self-checksing detector according to the invention.

In FIG. 1 it is seen that the detector according to the invention is fully continued within the frame or housing 1 which is connected to a remote receiver, not shown, by a cable with two conductors 2, 3, or several meters to several thousands of meters in length. Lines 2, 3 also provide the power supply of the sensor. Between the two conductors of this line 2, 3 a Zener diode 4 is provided, for protecting the detector from any overvoltages in the connecting line 2, 3. On conductor 2, reference numeral 5 represents a controlled current generator capable of letting through two clearly different values of current. The lower of the two current values must be higher than the actual consumption of the detector, which is of the order of 0.5. to 1 mA. The current generator is controlled via two paths: one path 8 corresponds to the position of target 6 relative to the limit 7 of the proximity zone monitored by the detector 1; the other path 9, corresponds to a control, the operation of which will be described below.

After the current generator 5, a second Zener diode 10 is provided between the two lines 2,3 to protect the internal power supply of the various components of the circuit, which power supply has not been shown for reasons of clarity of the drawing.

The detector comprises essentially a resonant circuit of an inductor L and capacitor C and a circuit 11 which is at the same time an oscillating circuit and a detector of the presence of oscillations in the LC circuit. This circuit !1 has three outputs 12, 13, 14. Between outputs 12 and 13 a resistor 15 is disposed, the value of which is adjustable to define the position of the limit 7. In parallel with the resistor 15 is provided a circuit 17 described with respect to FIG. 2, capable of controlling the stopping of the oscillations.

Output 12 of the oscillator 11 is connected to one input of a comparator 18, the other input of which is supplied a reference voltage 19. The output of comparator 18 is applied to the input of a multi-bit binary counter 20. The output Q9 corresponding to the bit of counter row 9 controls a monostable circuit 21, the output of which controls on the one hand directly a circuit 16 which is described with respect to FIG. 2, and on the other hand, through an inverter 22, the circuit 17, in such a way that these two circuits are in service alternately. When circuit 16 is energized it ensures that the oscillator 11 oscillates, thereby effectively shifting the zone 7 so that the target is outside of the zone. The output Q11, corresponding to the bit of row 11, is connected to a NOT OR (NOR) gate 23, the output of which corresponds to the second control path 9 of the current generator 5. The output Q12, corresponding to the bit of row 12 of counter 20, is connected on the one hand to NOT OR gate 23, and on the other hand to a circuit 24 controlling the resetting to zero of the counter 20 after a defined duration, and lastly to the circuits 16 and 17. Circuit 24 is configured such that if output Q12 returns to zero before the end of said defined duration, then the zeroing command is cancelled.

Figure 3:
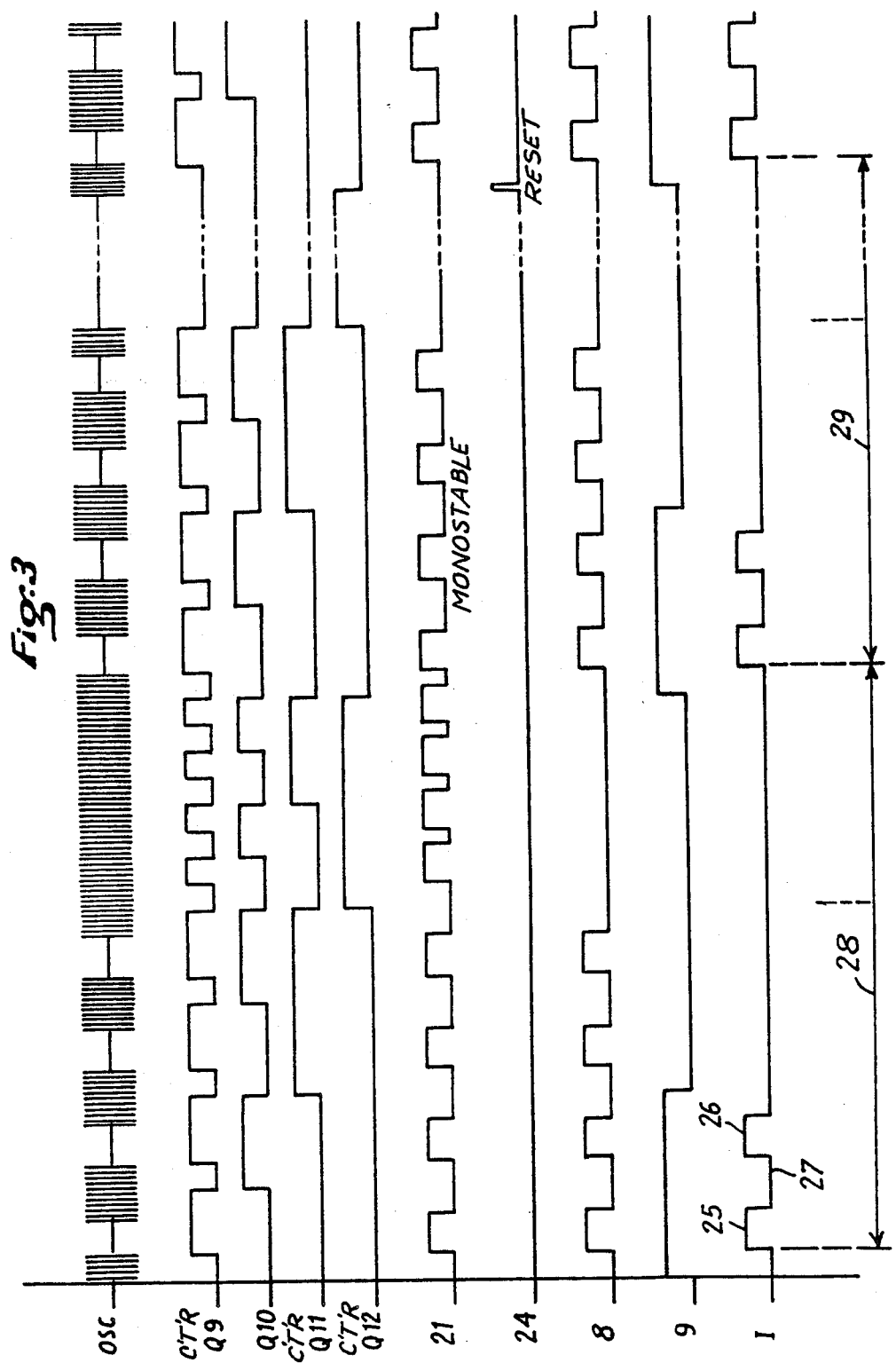
FIG. 3 is a diagram of the electric signals marked at various points of the circuit of FIG. 1.

The operation of the circuit of FIG. 1 will now be described with reference to the diagram of FIG. 3, which is representative of the electric signals at different points of the circuit. As the detector 1 is of the Eddy current type, the presence of oscillations in the LC circuit is established when the target 6 is in remote position, that is, beyond (to the left of) the limit 7, and the absence of oscillations, when it is in close position, that is, this side (to the right of) the limit 7 with respect to the detector 1.

To assure the checking of the proper functioning of the sensor, while detecting the position of the target relative to the limit of the proximity zone to be monitored, one proceeds as follows. In a cyclical manner the oscillator is forced to oscillate regardless of the position of the target, then it is stopped, again regardless of the position of the target. This alternation can be repeated several times, and then the oscillator is released to detect the position of the target. To force the oscillations, the LC circuit is not acted upon directly, but by means of the circuit 16 to clearly displace the zone limit 7 toward the detector 1 so that the target 6 is beyond (to the left of) the new limit, regardless of its real position. In practice, the circuit 16 has a low resistance which is placed in parallel with resistor 15, with the result that the zone limit is brought very close to the detector 1. As the target is then seen by the sensor as beyond the limit 7, th oscillator oscillates and controls the current generator 5 via path 8, so that the current I on line 2, 3 is low. Thus, the verification includes the oscillating LC circuit, the electronic oscillator and the oscillation detector symbolized by circuit 11.

The oscillations present at the output 12 of the oscillator are applied to the comparator 18 which transforms them into square wave signals counted by the counter 20. It can be noted that the counter 20 is fed, not by an independent clock, but by the oscillator itself. If there are no oscillations, there can be no counting. The detector thus has an intrinsic check, or self-check.

When the detector is energized, the counter sets to zero and, in the absence of a command, the monostable circuit 21 controls the operation of circuit 16 and of the oscillator 11. The oscillations, transformed into pulses by the comparator 18, are counted in counter 20. After a certain number of pulses has been counted, the output Q9 goes to logic state 1 and controls the flipping of the monostable circuit 21, thereby blocking circuit 16, causing circuit 17 to operate and the oscillations to stop. Circuit 11 detects the absence of oscillations in the LC circuit and, as a result, controls via path 8 the current generator 5 which passes to the high-value current for the duration of the pulse of the monostable circuit 21. In FIG. 3, the corresponding pulse of current I is designated by 25 on the last line.

When the monostable circuit 21 flips back, it suppresses the stopping of the oscillations by circuit 17 and controls the operation of the oscillator 11, through circuit 16. Because of the presence of the oscillations, circuit 11 controls, via path 8, the current generator 5 for its return to the low-value current. At the same time, the counting of the pulses begins again, until the output Q9 goes back to logical state 1. Thus, as seen in FIG. 3, one obtains a second pulse 26 of current I which is separated from the first pulse 25 by a time gap 27.

The alternating operation of oscillator 11 continues, with its periods of oscillation and its periods of blockage. When output Q11 goes to logical state 1, the gate 23 changes its output state and controls, via path 9, the current generator 5 to impose a low-value current (line 9 in FIG. 3), whatever is the command given via path 8.

When output Q11 goes back to logical state 0, output Q12 simultaneously passes to logical state 1, controls the blocking of the two circuits 16 and 17, and releases circuit 24 for its predetermined duration. The oscillator circuit 11 is then free to function to detect the position of target 6 relative to the zone limit 7.

If the target is remote, oscillator 11 oscillates freely, and the counting proceeds until output Q12 returns to state 0 and inhibits circuit 24. The initial process then starts over again and continues until the current I remains at its low value. In FIG. 3, bottom, the segment 28 represents the duration of a complete operating cycle of the detector when the target is remote. The portion of the cycle to the left of the vertical dotted line represents the detector function check phase, and the portion of the cycle 28 to the right of the dotted line represents the target position detection phase.

If the target is close at the time of passage of output Q12 to logical state 1, the oscillator 11 is free to oscillate but the presence of the target blocks the oscillations. Then everything occurs as represented in the right-hand portion of the last line of FIG. 3, in which segment 29 represents a complete operating cycle of the detector when the target is close. In this cycle 29, the portion to the left of the vertical dotted line corresponds to the detector function check phase, which is identical with that of cycle 28, and the portion to the right of the dotted line corresponds to the target position detection phase. Because there are no longer any oscillations, there is no more counting by counter 20. At the end of the given duration which characterizes it, counter reset circuit 24 controls the zeroing of counter 20 (line 24, FIG. 3), which again triggers the initial process.

The signal received by the receiver at the end of the power supply line 2-3 is composed, therefore, of two current pulses 25, 26 separated by a time gap 27, two successive pairs of these pulses being separated by a space of defined duration as a function of the position of the target relative to the limit of the proximity zone monitored.

An analysis this signal, therefore, gives the same time the position of the target and the state of operation of the detector. In fact, the duration of the current pulses 25, 26 equals the duration of the pulse of the monostable circuit 21, and it must therefore be constant and known when the functioning of the sensor is correct. The duration of the time gap 27 which separates the two pulses of a pair is given by a pulse count, the frequency of which is defined by the LC circuit of the oscillator. The width (time duration) of gap 27 can be measured in order to deduce therefrom the frequency of the LC circuit, and to verify that this frequency is indeed the nominal frequency of the LC circuit, and hence that the functioning of the oscillator is correct.

The recurrence frequency of the current pulse pairs permits defining the position of the target relative to the limit of the proximity zone. The recurrence frequency is higher when the target is remote than when it is near. The duration which separates two pulse pairs is the sum of short counting times, of stoppage times defined by the monostable circuit 21, and of a long counting time when the target is remote, or of the period of the circuit 24 when the target is close. Measurement of the duration which separates two pulse pairs thus permits an additional verification for the frequency of the LC circuit, the pulse duration of the monostable circuit 21, and possibly for the duration of the period of counter reset circuit 24.

In short, if the signals received at end of lines 2,3 do not correspond to one of the models, for the remote target and for the close target, respectively, one can deduce therefrom the existence of a fault of operation of the detector.

Figure 2:
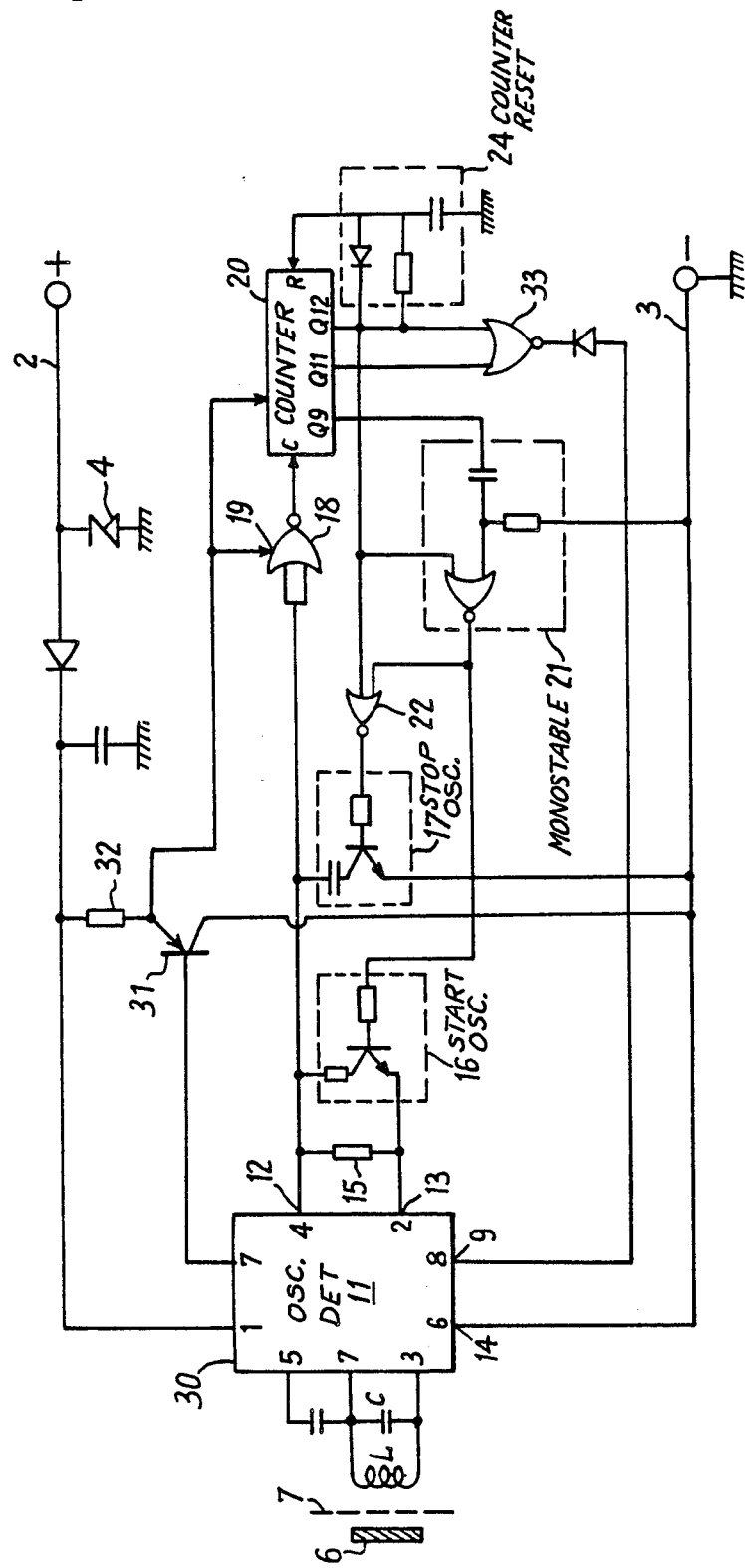
FIG. 2 is a circuit diagram of an example of realization of a self-checking detector according to the invention.

FIG. 2 shows a diagram of a circuit corresponding to an example of practical realization of the detector according to the invention. The reference numbers of FIG. 1 have been used in FIG. 2 where appropriate. The apparent difference between the two Figures is due to the fact that the integrated circuit 30 of FIG. 2 performs the functions of the circuits 11 and 5 of FIG. 1. The terminals of this circuit, which is of the type TDA 161 of THOMSON, have been labeled in the usual manner. For clarity of the drawing, terminal 7 has been shown at two different locations. Between the terminals 5 and 7 a capacitor is shown which is recommended for proper operation of circuit 30.

Transistor 31, in series with resistor 32, ensuring the power supply of counter 20 as well as the reference voltage polarization of gate 18, which acts as a comparator.

Circuit 16 comprises a transistor with a small value resistor in its collector-emitter path to control the placing in parallel of this resistor with resistor 15 and thus to lower the resistance seen by circuit 30, which amounts to shifting the zone limit 7 toward the detector.

Circuit 17 comprises a transistor with a capacitor in its collector-emitter path to ensure the grounding of the output 12 of circuit 30, as far as the alternating signals are concerned. The circuits 21 and 24 are circuits with clearly different time constants.

In an example of realization of a detector of this type, the practical values may be approximately: an oscillation frequency of the LC circuit of about 200 kHz; current pulse duration of 0.5 to 1 ms; a spacing b two current pulses of one and the same pair of 2 to 2.5 ms; an interval between two current pulse pairs of 5 to 15 ms when the target is remote, and of 20 to 40 ms when the target is close; a low value of the current of 1 to 2 mA; a high value of the current of 10 to 15 mA; and an average consumption of the detector of 3 to 4 mA. Such a detector is especially well adapted for position control of the movable members in an airplane for example, such as doors or landing gear.

Figure 4:
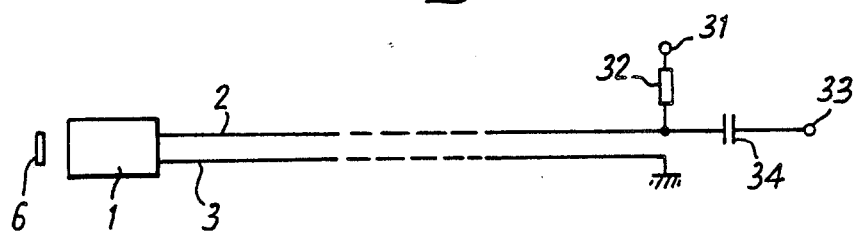
FIG. 4 is a diagram of a first embodiment of a detector according to the invention with its power-supply and receiving circuits.

In FIG. 4 there is a schematic representation of the detector 1 with the target 6 and its two power supply wires 2 and 3. Wire 2 is connected to a power supply source 31 through a resistor 32, and to the input 33 of the measuring receiver through a capacitance 34.

Figure 5:
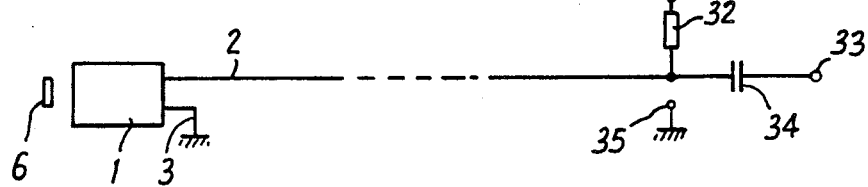
FIG. 5 is a diagram of a second embodiment of a detector according to the invention with its power-supply and receiving circuits.

In the schematic representation of FIG. 5, the return wire 3 has been eliminated. At the output of detector 1, this wire is connected to ground or to a return wire common to several detectors. The terminal 35, connected to ground, symbolizes the common terminal of the power supply and receiving circuit.

Figure 6:
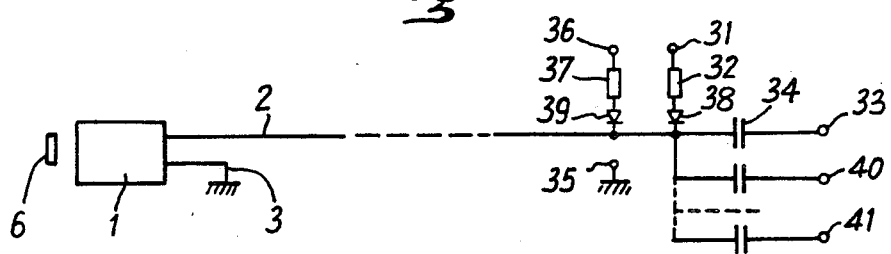
FIG. 6 is a diagram of a third form of embodiment of a detector according to the invention with its power-supply and receiving circuits.

In FIG. 6 a schematic representation is shown of a first power supply source 31, with its resistor 32 and a protection diode 38 in series. A second power supply source 36 is provided, with a resistor 37 and a protection diode 39. The two power supply sources can then operate in parallel, without risk.

Regardless of the mode of realization of the power supply, several receiver may be provided in parallel as in the example of FIG. 6, symbolized by their inputs 33, 40, 41.

Figure 7:
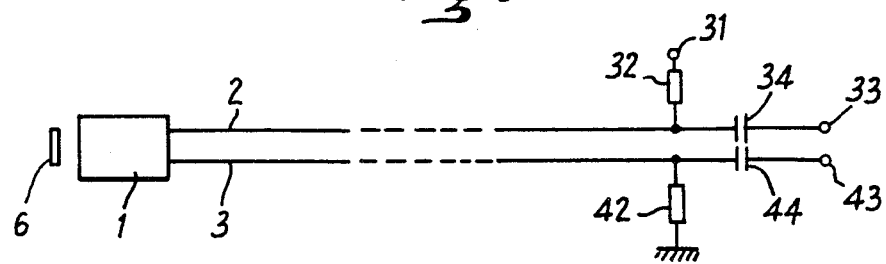
FIG. 7 is a diagram of a fourth embodiment of a detector according to the invention with its power-supply and receiving circuits.

In FIG. 7 there is schematically shown a special mode of realization in which the receiver has a symmetrical input. The input of the receiver consists of the two terminals 33 and 43, each having a capacitor 34 and 44, respectively. Between the return conductor 3 and ground, a resistor 42 is disposed. In this manner, the charge of the power supply source 32 is distributed over the two resistors 32 and 42.

Owing to the presence of the current generators, the detector according to the invention can be powered from a voltage source which is not stabilized and is variable within wide limits. Because of this, there may be a return wire common to several detectors, or even a ground return, and the detector may be considered as connected to its power supply and to its receiver by a single wire.

The detector according to the invention offers several advantages. There are only two wires, namely a power-supply and control wire and a return wire, which may, besides, be common to several detectors. The electronic system, being integrated in the detector, works under favorable conditions of detection. The electronic circuit is very confined, thereby reducing the risk of breakdowns. There is no independent clock for generating pulses to be counted, and this ensures the self-check of the detector. Owing to this self-check, the proper operating state of the detector is known at all times. The signals transmitted by the detector are simple and well defined and they consist of a predetermined variation of the current strength. These signals consist of pairs of pulses, the recurrence frequency of which depends on the position of the target relative to the limit of the proximity zone. The presence of the pairs of pulses, the width of each pulse and the time duration of the gap separating the two pulses of a pair are as many measurable elements for appraising the proper functioning of the detector.

The detector according to the invention has an integrated electronic system, it checks itself at all times, and it transmits to one or more receivers the information about its functioning simultaneously with the information about the position of the target in two states - beyond and this side of the limit of the proximity zone monitored by the detector.

I claim:

1. The combination comprising:
   a proximity detector with an integrated electronic system including an oscillator means for detecting the position of a target relative to a proximity zone limit by Eddy current changes,
   means for controlling said detector to operate during a cycle for a first period to check the functioning of the detector and for a second period for determining the position of the target, said controlling means comprising means for alternately operating said oscillator to produce oscillations and to stop oscillating at predetermined times during said first period to check the functioning of said detector without regard to the position of the target.

2. The combination according to claim 1 wherein said operating means comprises: a first circuit for bringing about the operation of the oscillator, a second circuit for controlling the stopping of the oscillations, a monostable circuit for controlling, alternately, one or the other of the first and second circuits, and a counter for counting the oscillations which it receives from the oscillator, and controlling the monostable circuit in response thereto.

3. The combination according to claim 2, further comprising means for resetting the counter to zero after a defined duration, so as to end the second period of the operating cycle of the detector in the absence of oscillations, that is, when the target is close.

4. The combination according to claim 2, further comprising means responsive to the production and stopping of the oscillations during the first period of the operating cycle of the detector, the signals permitting the checking of the correct functioning of the detector for producing two current pulses.

5. The combination according to claim 4, wherein said monostable circuit produces a pulse and each of said current pulses has a duration equal to that of the pulse of the monostable circuit.

6. The combination according to claim 4, wherein the duration of said gap between the two current pulses is a function of the frequency of the oscillations.

7. The combination according to claim 1, wherein the duration of the second period of the operating cycle of the detector is characteristic of the position of the target relative to the limit of the proximity zone.

8. The combination according to claim 7, wherein when the target is remote the oscillator produces oscillations and the duration of said second period of the cycle is defined by counting of the oscillations.

9. The combination according to claim 1 further comprising a current generator capable of being controlled via two paths from said proximity detector, said current generator being electrically connected with a wire of a power supply line connected to a voltage source.

10. The combination according to claim 9 further comprising a return wire for said current generator which can be used as a common line for several detectors.

11. The combination according to claim 9 further comprising return wire which is grounded at the output of the detector.

12. The combination according to claim 2, further comprising means for resetting the counter to zero after a defined duration, so as to end the second period of the operating cycle of the detector in the absence of oscillations, that is, when the target is close.

13. The combination according to claim 12 wherein that when the target is close, the duration of said second period of the cycle is defined by the period of said resetting means.

* * * * *